US006964276B2

(12) United States Patent
Shulman et al.

(10) Patent No.: US 6,964,276 B2
(45) Date of Patent: Nov. 15, 2005

(54) WAFER MONITORING SYSTEM

(75) Inventors: Benjamin Shulman, Rehovot (IL); Yoav Alper, Nes Ziona (IL)

(73) Assignee: Nova Measuring Instruments Ltd., Rehovet (IL)

( * ) Notice: Subject to any disclaimer, the term of this patent is extended or adjusted under 35 U.S.C. 154(b) by 0 days.

(21) Appl. No.: 10/232,384

(22) Filed: Sep. 3, 2002

(65) Prior Publication Data

US 2004/0041148 A1 Mar. 4, 2004

(51) Int. Cl.[7] ............................ B08B 3/04; B65G 49/07

(52) U.S. Cl. ........................ 134/133; 134/902; 414/806

(58) Field of Search ................................ 414/806, 941, 414/935, 936, 937; 134/133, 902; 73/865.8, 863; 324/754, 758, 761

(56) References Cited

U.S. PATENT DOCUMENTS

| | | | |
|---|---|---|---|
| 4,775,281 A | | 10/1988 | Prentakis |
| 5,171,031 A | | 12/1992 | Nishiyama |
| 5,566,466 A | | 10/1996 | Hearne |
| 5,700,046 A | | 12/1997 | Van Doren et al. |
| 5,851,041 A | | 12/1998 | Anderson et al. |
| 6,036,426 A | | 3/2000 | Hillman |
| 6,082,950 A | | 7/2000 | Altwood et al. |
| 6,099,643 A | | 8/2000 | Ohtani et al. |
| 6,174,011 B1 | | 1/2001 | Keigler |
| 6,212,961 B1 | * | 4/2001 | Dvir .......................... 73/865.8 |
| 6,267,423 B1 | | 7/2001 | Marohl et al. |
| 6,273,484 B1 | | 8/2001 | Peng |
| 6,309,163 B1 | | 10/2001 | Nering |
| 6,343,905 B1 | | 2/2002 | Adams et al. |
| 6,368,182 B2 | | 4/2002 | Dvir et al. |
| 6,390,767 B1 | | 5/2002 | Alper et al. |
| 6,485,253 B1 | | 11/2002 | Adams et al. |
| 6,543,461 B2 | | 4/2003 | Haimovich et al. |
| 6,619,144 B2 | | 9/2003 | Dvir |

FOREIGN PATENT DOCUMENTS

| | | |
|---|---|---|
| JP | 62295839 A | 12/1987 |

* cited by examiner

*Primary Examiner*—Minh-Loan Tran
(74) *Attorney, Agent, or Firm*—Dekel Patent Ltd.; David Klein

(57) ABSTRACT

A wafer monitoring system including a gripper operative to fixedly hold a wafer, a bottom buffering unit comprising at least one supporting element adapted to support a wafer, a top buffering unit comprising at least two supporting elements adapted to support a wafer, a first actuator operative to effect relative movement between at least two supporting elements of the top buffering unit, monitoring apparatus operative to perform processing steps on a wafer while the wafer is held fixed to the gripper, and an actuator operative to effect relative movement between the gripper and the top and bottom buffering units, the top and bottom buffering units being operative to buffer processed and unprocessed wafers thereby to enable a robot to arrive at and leave the monitoring apparatus with at least one wafer thereon.

24 Claims, 7 Drawing Sheets

WAFER MONITORING SYSTEM

FIELD OF THE INVENTION

The present invention relates generally to handling and robotics systems, such as those used in semiconductor processing control systems, in particular to a wafer monitoring system for a wafer handling system.

BACKGROUND OF THE INVENTION

Semiconductor fabrication plants typically handle, process, inspect and measure wafers. One example of equipment used in such processing operations and handling systems is an integrated metrology tool. The term "integrated monitoring tool", as used herein, refers to a monitoring (e.g., metrology, inspection) apparatus that is preferably physically installed inside a wafer processing tool or attached to it. However, it can also be separated form the processing unit, as necessary. The monitoring tool is usually dedicated to the specific processing unit and wafers are preferably transferred to the tool by a robot. The same robot may serve the processing unit as well. One exemplary process environment uses the NovaScan 2020 integrated metrology tool, commercially available from NOVA Measuring Instruments Ltd. of Rehovot, Israel, and its handling system.

Examples of processing units and buffer stations for use in such process environments are described in U.S. Pat. No. 6,212,961 to Dvir, assigned to NOVA Measuring Instruments Ltd. Rehovot, Israel. The processing unit of U.S. Pat. No. 6,212,961 comprises a processing station for processing one or more wafers, a measuring station for measuring the wafers, a robot for moving the wafers between the processing and measuring stations, a wafer handling system and a buffer station. The wafer handling system operates in conjunction with the measuring station and moves the wafer to and from a measuring location on the measuring unit. The buffer station is associated with the wafer handling system and receives measured and unmeasured wafers thereby to enable the robot to arrive at and leave the measuring station with at least one wafer thereon.

In the prior art, the wafer may be held by some sort of gripping device (e.g., a vacuum gripper), and the wafer handling system takes the wafer from the gripping device to the station where measurements (or other process steps, e.g., metrology or inspection) are carried out.

SUMMARY OF THE INVENTION

The present invention seeks to provide a novel wafer monitoring system for a wafer handling system.

There is thus provided in accordance with a preferred embodiment of the present invention a wafer monitoring system including a gripper operative to fixedly hold a wafer, a bottom buffering unit including at least one supporting element adapted to support a wafer, a top buffering unit including at least two supporting elements adapted to support a wafer, a first actuator operative to effect relative movement between at least two supporting elements of the top buffering unit, monitoring apparatus operative to perform processing steps on a wafer while the wafer is held fixed to the gripper, and an actuator operative to effect relative movement along a Z-axis between the gripper and the top and bottom buffering units, the top and bottom buffering units being operative to buffer processed and unprocessed wafers thereby to enable a robot to arrive at and leave the monitoring apparatus with at least one wafer thereon.

In accordance with a preferred embodiment of the present invention the supporting element of the bottom buffering unit includes at least three supporting subelements.

Further in accordance with a preferred embodiment of the present invention the supporting element of the bottom buffering unit includes at least four supporting subelements.

Still further in accordance with a preferred embodiment of the present invention the at least one supporting element of the top buffering unit is movable inwards and outwards between an open position, which does not support a wafer, and a closed position which does support a wafer.

In accordance with a preferred embodiment of the present invention the top buffering unit includes at least three supporting elements.

Further in accordance with a preferred embodiment of the present invention the top buffering unit includes at least four supporting elements.

Still further in accordance with a preferred embodiment of the present invention at least one supporting element of the top buffering unit is translatable along a longitudinal axis.

In accordance with a preferred embodiment of the present invention the at least three supporting elements are rotatable.

Further in accordance with a preferred embodiment of the present invention the at least four supporting elements are rotatable.

Still further in accordance with a preferred embodiment of the present invention each of the at least three supporting sub-elements of the bottom buffering unit includes a pin having a top inclined portion, a substantially vertical portion and a substantially horizontal portion.

In accordance with a preferred embodiment of the present invention each of the at least three supporting sub-elements of the bottom buffering unit includes a pin having a top inclined portion, a substantially vertical portion and a substantially horizontal portion.

Further in accordance with a preferred embodiment of the present invention the top inclined portion is conical.

Still further in accordance with a preferred embodiment of the present invention top inclined portion is conical.

In accordance with a preferred embodiment of the present invention each of the at least three supporting elements of the top buffering unit includes an inclined supporting surface and a substantially vertical guiding edge portion.

Further in accordance with a preferred embodiment of the present invention each of the at least four supporting elements of the top buffering unit includes an inclined supporting surface and a substantially vertical guiding edge portion.

Still further in accordance with a preferred embodiment of the present invention each of the at least three supporting elements of the top buffering unit includes an inclined supporting surface and a substantially vertical guiding edge portion.

In accordance with a preferred embodiment of the present invention each of the at least four supporting elements of the top buffering unit includes an inclined supporting surface and a substantially vertical guiding edge portion.

Further in accordance with a preferred embodiment of the present invention the top and bottom buffering units are mounted on a common frame.

Still further in accordance with a preferred embodiment of the present invention the actuator is operative to move the gripper with respect to the top and bottom buffering units.

In accordance with a preferred embodiment of the present invention the actuator is operative to move the top and bottom buffering units with respect to the gripper.

Further in accordance with a preferred embodiment of the present invention the actuator is operative to move the gripper and top and bottom buffering units.

Still further in accordance with a preferred embodiment of the present invention buffer limits stop the rotation of at least one supporting element of the top buffering unit at predetermined angular positions.

In accordance with a preferred embodiment of the present invention the gripper is rotatable about a longitudinal axis.

Further in accordance with a preferred embodiment of the present invention the gripper is translatable along a longitudinal axis.

Still further in accordance with a preferred embodiment of the present invention the gripper is rotatable and translatable along a longitudinal axis.

In accordance with a preferred embodiment of the present invention the bottom buffering unit is situated above the gripper.

Further in accordance with a preferred embodiment of the present invention the top buffering unit is situated above the bottom buffering unit.

BRIEF DESCRIPTION OF THE DRAWINGS

The present invention will be understood and appreciated more fully from the following detailed description taken in conjunction with the appended drawings in which:

FIGS. 4–9 are simplified side-view illustrations of using the buffer and wafer handling system to move and handle wafers, in accordance with a preferred embodiment of the present invention, wherein:

FIG. 4 is a simplified illustration of a robot bringing a wafer to the buffer and wafer handling system, prior to placement upon the load station;

FIG. 5 is a simplified illustration of the robot having lowered the wafer on to the bottom buffering unit;

FIG. 6 is a simplified illustration of the gripper moved relative to the buffer and monitoring apparatus, wherein the wafer is ready for monitoring operations (e.g., metrology, inspection, measurement, etc.);

FIG. 7 is a simplified illustration of the top buffering unit lifting the wafer from the gripper;

FIG. 8 is a simplified illustration of the robot, after having lowered the new wafer on to the bottom buffering unit and moving away from the new wafer, with the previous wafer still on the top buffering unit; and FIG. 9 is a simplified illustration of the robot about to lift the previous (processed) wafer from the top buffering unit.

DETAILED DESCRIPTION OF THE PRESENT INVENTION

Figure 1:
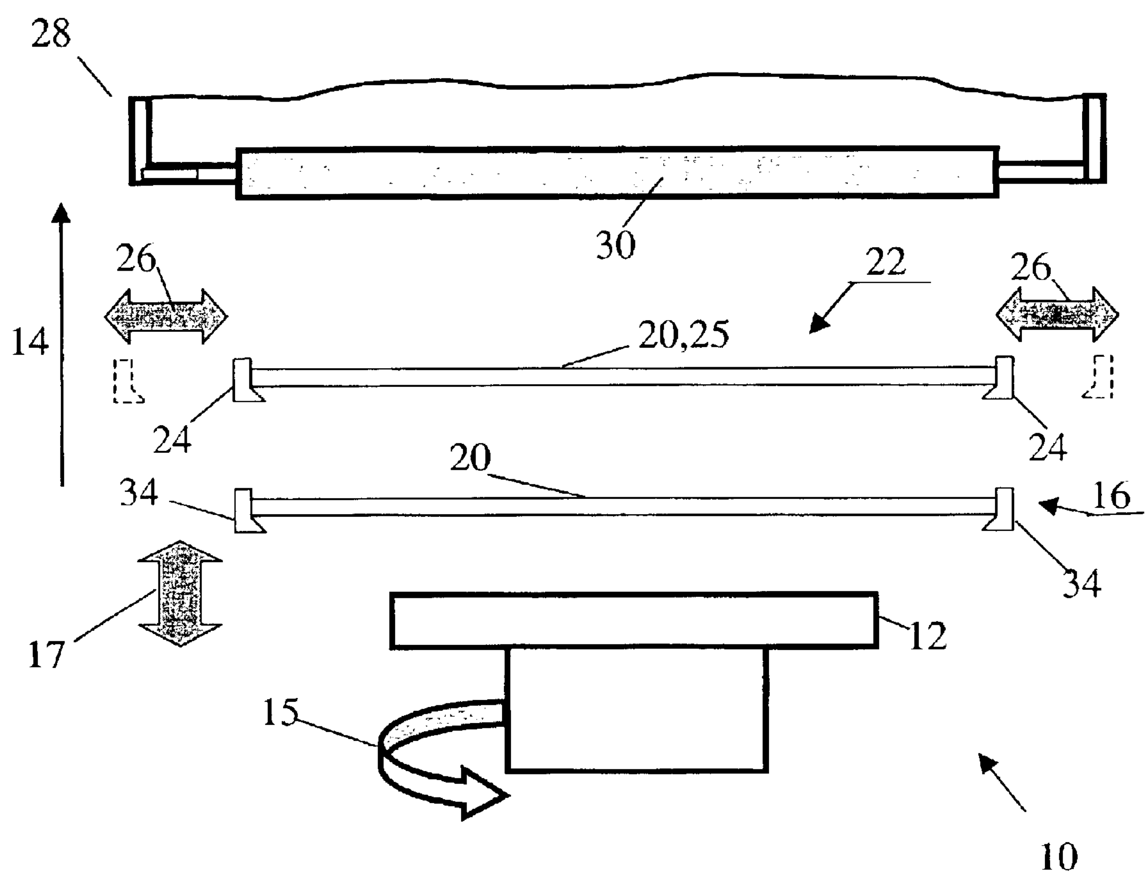
FIG. 1 is a simplified schematic illustration of a monitoring system provided with a buffer and wafer handling system, constructed and operative in accordance with a preferred embodiment of the present invention, showing a gripper, top buffering unit, bottom buffering unit and monitoring apparatus.

Reference is now made to FIG. 1, which schematically illustrates a buffer and wafer handling system 10, constructed and operative in accordance with a preferred embodiment of the present invention. System 10 preferably includes a gripper 12, such as but not limited to, a vacuum gripper, which may fixedly hold a wafer. Gripper 12 may be rotatable (as indicated by arrow 15) about a longitudinal axis 14, also referred to herein as the z-axis, and may be translatable along Z-axis 14 (as indicated by arrows 17). The translation of gripper 12 along the Z-axis 14 may be helpful in loading or unloading wafers, and fine translations may enable auto-focusing when using optical monitoring apparatus. Additionally, gripper 12 may be mounted on a linear drive for translation along one of the horizontal axes X or Y. System 10 may comprise a bottom (lower) buffering unit 16 situated above gripper 12, which may include one or more supporting elements 34 that may support a wafer 20. Supporting element 34 are preferably stationary, although alternatively, may be movable inwards and outwards.

System 10 may comprise a top (upper) buffering unit 22 situated above bottom buffering unit 16, which may include at least two or more supporting elements 24 that may support a wafer (either the same wafer 20 or another wafer 25, as will be explained hereinbelow). Supporting elements 24 are preferably movable inwards and outwards, as indicated by arrows 26. Both buffering units 16 and 22 may be translatable along longitudinal axis 14 (the Z-axis) in addition to or instead of translation of gripper 12.

System 10 may comprise monitoring apparatus 28, which is the station where measurements or other process steps, e.g., metrology or inspection, may be carried out on the wafer. It is noted that throughout the specification and claims, the term “monitoring apparatus” comprises any device (e.g., an integrated monitoring tool) for carrying out processing steps on the wafer, such as but not limited to, measurements, metrology and inspection. Monitoring apparatus 28 may include, although not necessarily, a window 30 for optically viewing the wafer, e.g., for optical inspection or measuring.

Figure 2:
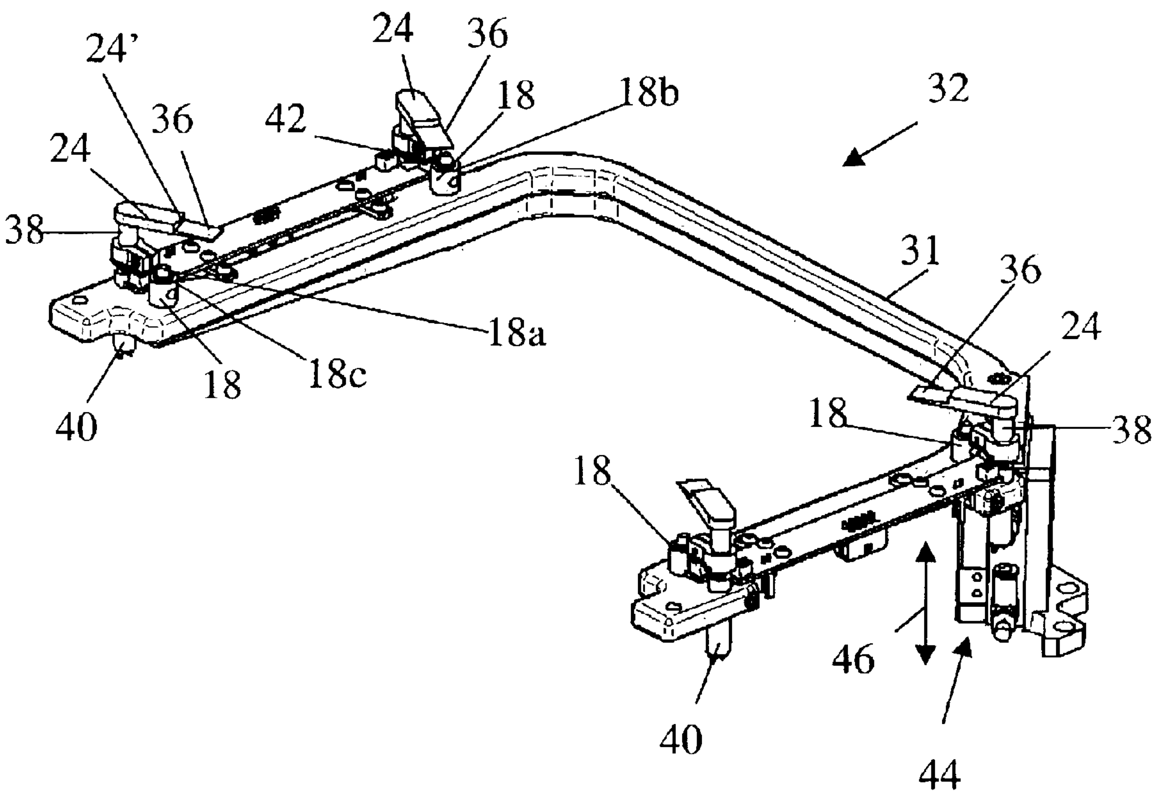
FIG. 2 is a simplified pictorial illustration of an actuator system used to operate the top buffering unit and bottom buffering units of FIG. 1, in accordance with one preferred embodiment of the present invention.

Reference is now made to FIG. 2, which schematically illustrates an actuator system 32, which may be used to operate the buffering units 16 and 22 of system 10. It is emphasized that FIG. 2 illustrates just one embodiment for carrying out the invention, preferably when gripper 12 is not translatable along Z-axis 14, but it is appreciated that the invention is not limited to the construction shown in FIG. 2.

In the illustrated embodiment, the supporting element 34 of bottom buffering unit 16 may comprise stationary supporting sub-elements, e.g., pin wafer holders 18 mounted on a supporting frame 31. Four such pin wafer holders 18 are shown in FIG. 2, but other amounts may be used as well. In order to provide fine centering of the wafer to be monitored, at least three pin wafer holders 18 may be provided. Since the wafer’s edge usually has an orientation mark, (typically referred to as a notch or flat), pin wafer holders 18 may be used in order to provide accurate centering and reliable supporting of arbitrary oriented wafer. Even if the orientation mark falls on one of the wafer holders, there are still three wafer holders that may provide necessary centering and reliable supporting. In three pin wafer holders 18 were to be used, additional means for angular orientation of the wafer may be used so that the desired orientation of the wafer avoids the orientation marks falling on one of the wafer holders. Preferably, pin wafer holders 18 have an inclined top (conical) portion 18A, a substantially vertical portion 18B and a substantially horizontal portion 18C. Such a configuration of pins enables delicate loading and unloading operations of bottom buffering unit 16 and additionally, accurate centering of the wafer prior to processing, e.g.

monitoring. It should be understood, that in order to center a wafer, the supporting elements may have substantially vertical portions, which contact the wafer edge at at least three different points.

Each supporting element 24 of top buffering unit 22 may comprise a pallet tongue with a wafer supporting surface 36, as shown in FIG. 2. Preferably, supporting surface 36 is slightly inclined (sloped) towards an end thereof, so as to provide minimal contact with the wafer surface. Additionally, supporting elements 24 have a substantially vertical guiding edge portion 24' which may help spatially fix the wafer when supporting elements 24 are in a "closed" position. The supporting element 24 may be rotatably mounted on a spindle 38 and rotated by a motor, such as but not limited to, a micromotor 40. The limits of the rotational movement of supporting element 24 may be defined by buffer limits 42, which stop the rotation of supporting element 24 at predetermined angular positions. Buffer limits 42 may be any kind of limit known in the art, such as but not limited to, a micro-contact type or non-contact type, such as magnetic, optical, and others. At least two movable supporting elements may be used in accordance with the present invention, such as but not limited to, supporting elements shown in U.S. Pat. No. 6,212,961.

Frame 31 is preferably mounted on a linear actuator 44 which is operative to move frame 31, together with top and bottom buffering units 22 and 16 formed by supporting elements 24 and 34 (18), up and down with respect to gripper 12 along Z-axis 14 (FIG. 1, not shown in FIG. 2 for simplicity sake), as indicated by arrows 46.

It will be appreciated that buffer and handling system 10 may also include a pre-alignment unit, as described in U.S. Pat. No. 6,212,961.

Figure 3A:
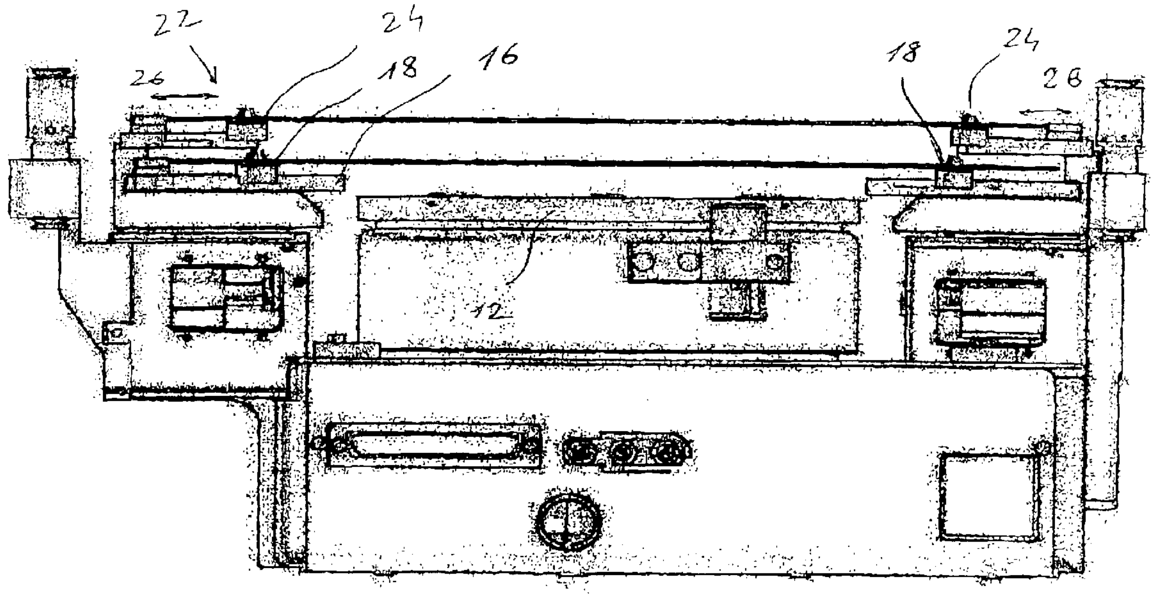
FIGS. 3A and 3B is a simplified pictorial illustrations of a buffer and wafer handling system used in the monitoring system of FIG. 1, in accordance with another preferred embodiment of the present invention.
Figure 3B:
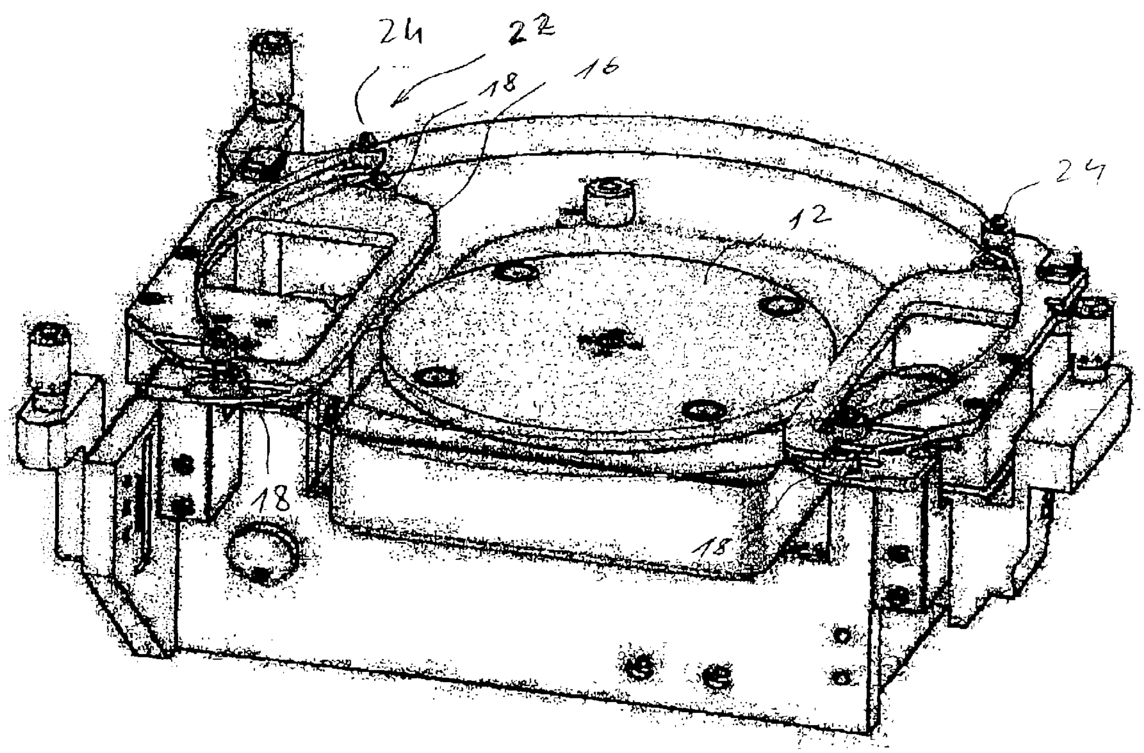

FIGS. 3A and 3B schematically illustrate another configuration of system 10 with gripper 12 being translatable along Z-axis 14 and top and bottom buffering units 16 and 22 being static. System 10 may comprise a bottom buffering unit 16 situated above gripper 12, which may include one or more supporting elements 18 that may support a wafer 20. Supporting elements 18 are preferably stationary, although alternatively, may be movable inwards and outwards.

System 10 may comprise an top buffering unit 22 situated above bottom buffering unit 16, which may include at least two or more supporting elements 24 that may support a wafer (either the same wafer 20 or another wafer 25, as will be explained hereinbelow). Supporting elements 24 are preferably linearly movable inwards and outwards, as indicated by arrows 26.

Reference is now made to FIGS. 4–9, which illustrate using the buffer and wafer handling system 10 to move and handle wafers, in accordance with a preferred embodiment of the present invention.

Figure 4:
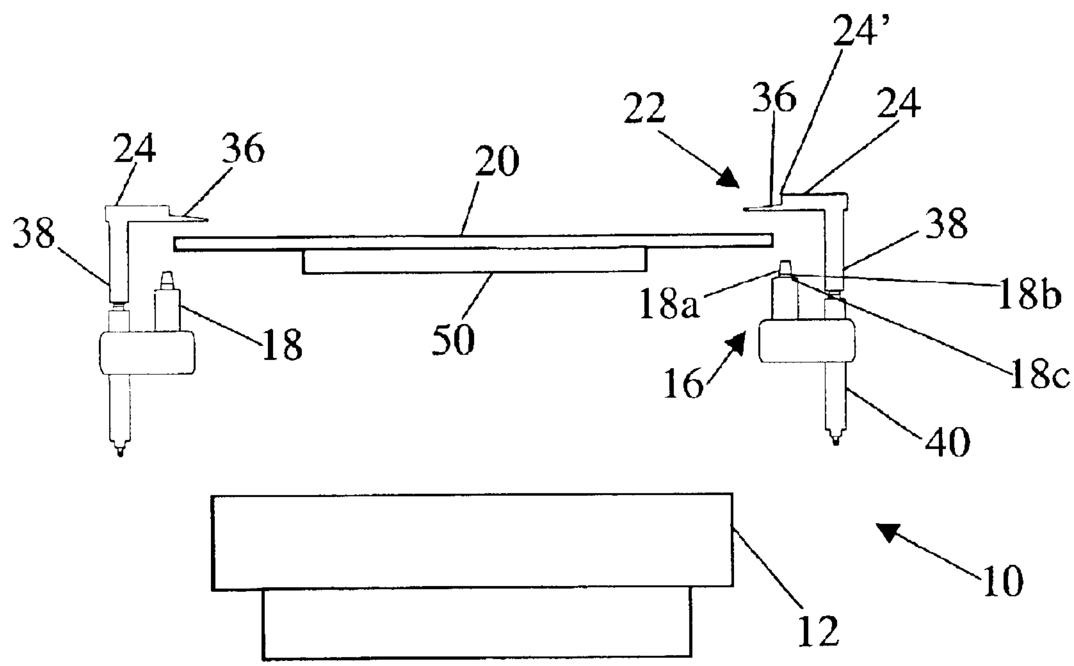
Figure 5:
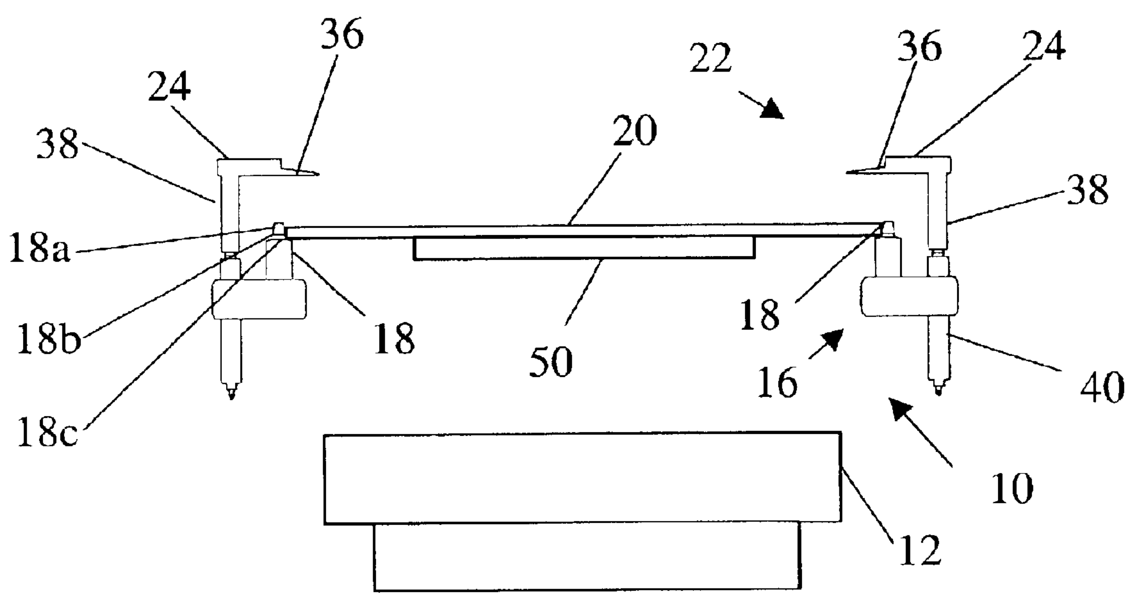

In FIG. 4, a robot 50 (which may also be referred to as an end effecter or robot arm) of a wafer processing tool, with which the monitoring tool is integrated (the rest of the processing tool not being shown for clarity sake), may bring a wafer 20 to buffer and handling system 10. FIG. 4 illustrates the wafer 20 being supported by the robot arm 50 prior to placement upon bottom buffering unit 16. Robot 50 moves downwards and lowers wafer 20 on to pin wafer holders 18 of bottom buffering unit 16. While being lowered, the wafer's edge may freely slide along top conical portions 18A of at least some of pin wafer holders 18, causing the wafer to move towards the center of system 10. The wafer may thus be centered upon abutting the substantially vertical portion 18B. The wafer 20 now rests on substantially horizontal (supporting) portion 18C of supporting elements 18, as shown in FIG. 5.

Micro-motors 40 may turn supporting elements 24 of top buffering unit 22, so that the support elements 24 are in an "open" position. Alternatively, the supporting elements 24 may always be in an "open" position, except during the step of holding the wafer on top buffering unit 22.

Figure 6:
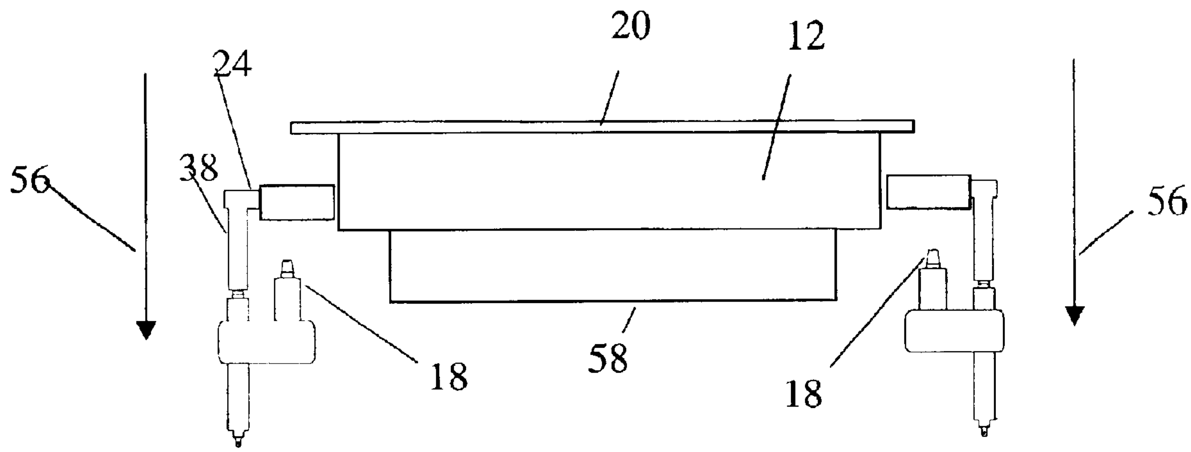

In FIG. 6, linear actuator 44 (shown in FIG. 2) moves top and bottom buffering units 22 and 16 downwards in the direction of arrow 56 with respect to gripper 12, thereby lowering wafer 20 on to gripper 12.

Figure 7:
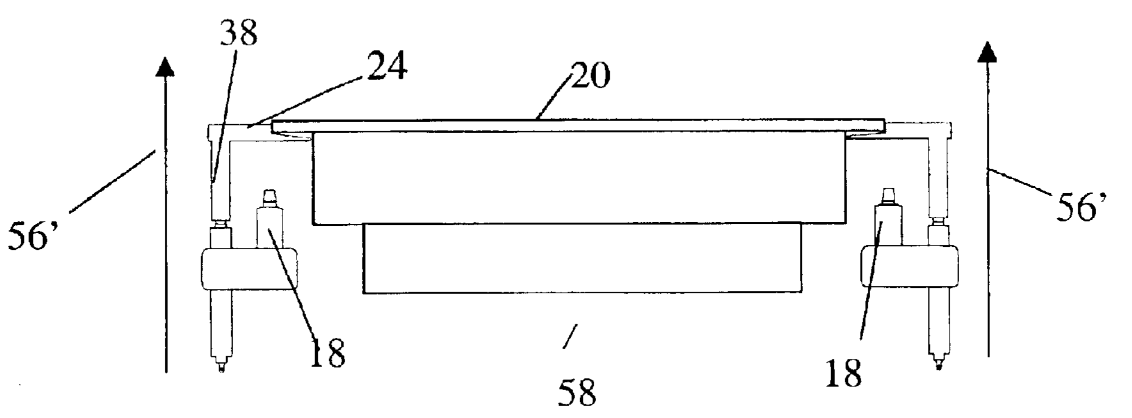

Alternatively, gripper 12 may be moved upwards, i.e. towards monitoring apparatus 28 by a linear actuator 58 (shown simplistically in FIG. 6). At this point, wafer 20 is ready for monitoring operations (e.g., metrology, inspection, measurement, etc.). It should be noted, that in order to provide auto-focusing, which may be needed for optical inspection or measurements, corresponding optical elements of monitoring apparatus 28 or of some other system may be additionally translatable along Z-axis 14. Still alternatively, both gripper 12 and corresponding optical elements or the entire monitoring apparatus 28 may be movable along Z-axis 14. After completing the monitoring operations (e.g., metrology, inspection, measurement, etc) linear actuator 44 (shown in FIG. 2) may move top and bottom buffering units 22 and 16 upwards in the direction of arrow 56' with respect to gripper 12 and micro-motors 40 may turn supporting elements 24 of top buffering unit 22 to a closed position Top buffering unit 22 may then be poised to lift wafer 20 from gripper 12, as shown in FIG. 7. Alternatively, micro-motors 40 may turn supporting elements 24 when the top buffering unit 22 reaches the level of gripper 12.

Figure 8:
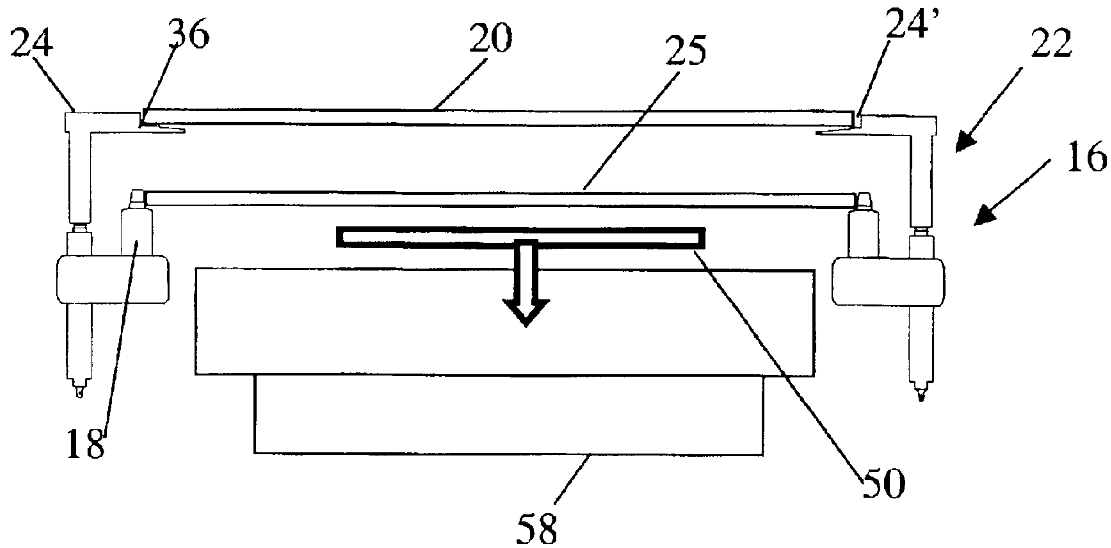

Then linear actuator 44 (shown in FIG. 2) may move top and bottom buffering units 22 and 16 further upwards with respect to gripper 12, thereby providing an initial state of the system 10, ready for loading a new wafer to be monitored. Robot 50 may bring a new wafer 25 to buffer and handling system 10 and lower it on to bottom buffering unit 16, while the previous (processed) wafer 20 is still on top buffering unit 22. In FIG. 8, after having lowered the new wafer 25 on to bottom buffering unit 16, robot 50 moves away from the new wafer 25. Then robot 50 is re-positioned in order, to take away the previous wafer 20 from top buffering unit 22.

Figure 9:
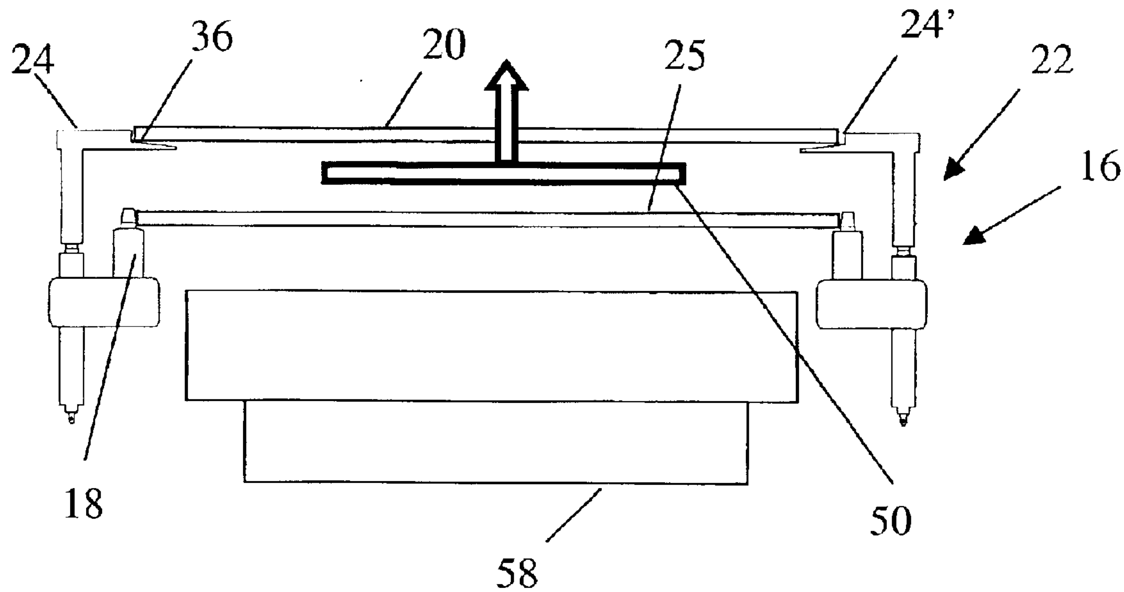

In FIG. 9, robot 50 is about to lift the previous wafer 20 from bottom buffering unit 16. Robot 50 may then lift the previous wafer 20 from top buffering unit 22 and transport the wafer from system 10, for example, to an unloading cassette or for further processing by a processing tool.

Now, after the previous wafer 20 has been removed and with the new wafer 25 on bottom buffering unit 16, the system is in the orientation of FIG. 5 and is ready for monitoring operations (e.g., metrology, inspection, measurement, etc.), as described hereinabove. The process may then be repeated for wafer 25 as described hereinabove for wafer 20.

The present invention may thus increase the speed and throughput of a wafer handling system, and simplify handling of wafers for inspection, metrology, measurement and any other desired action.

It will be appreciated by persons skilled in the art that the present invention is not limited by what has been particularly shown and described herein above. For example, top buffering unit may be used as load station and the bottom unit as an unload station, contrary to the illustrated example of operation. Rather the scope of the invention is defined by the claims that follow:

What is claimed is:

1. A wafer monitoring system comprising:

a gripper operative to fixedly hold a wafer;

a bottom buffering unit comprising at least one supporting element adapted to support a wafer;

a top buffering unit comprising at least two supporting elements adapted to support a wafer;

a first actuator operative to effect relative movement between at least two supporting elements of said top buffering unit;

monitoring apparatus operative to perform processing steps on a wafer while the wafer is held fixed to said gripper; and an actuator operative to effect relative movement along a Z-axis between said gripper and said top and bottom buffering units, said top and bottom buffering units being operative to buffer processed and unprocessed wafers thereby to enable a robot to arrive at and leave said monitoring apparatus with at least one wafer thereon, wherein said supporting clement of the bottom buffering unit comprises at least three support sub-elements comprising a pin having a top inclined portion, a substantially vertical portion and a substantially horizontal portion.

2. The system according to claim 1, wherein the supporting element of said bottom buffering unit comprises at least four supporting sub-elements.

3. The system according to claim 2, wherein each of said at least three supporting sub-elements of said bottom buffering unit comprises a pin having a top inclined portion, a substantially vertical portion and a substantially horizontal portion.

4. The system according to claim 3, wherein top inclined portion is conical.

5. The system according to claim 1, wherein said at least one supporting element of said top buffering unit is movable inwards and outwards between an open position, which does not support a wafer, and a closed position which does support a wafer.

6. The system according to claim 1, wherein said top buffering unit comprises at least three supporting elements.

7. The system according to claim 6, wherein said top buffering unit comprises at least four supporting elements.

8. The system according to claim 7, wherein said at least four supporting elements are rotatable.

9. The system according to claim 8, wherein each of said at least four supporting elements of the top buffering unit comprises an inclined supporting surface and a substantially vertical guiding edge portion.

10. The system according to claim 7, wherein each of said at least four supporting elements of the top buffering unit comprises an inclined supporting surface and a substantially vertical guiding edge portion.

11. The system according to claim 6, wherein said at least three supporting elements are rotatable.

12. The system according to claim 11, wherein each of said at least three supporting elements of the top buffering unit comprises an inclined supporting surface and a substantially vertical guiding edge portion.

13. The wafer monitoring system according to claim 11, further comprising buffer limits which stop the rotation of at least one supporting element of said top buffering unit at predetermined angular positions.

14. The system according to claim 6, wherein each of said at least three supporting elements of the top buffering unit comprises an inclined supporting surface and a substantially vertical guiding edge portion.

15. The system according to claim 1, wherein said top inclined portion is conical.

16. The system according to claim 1, wherein said top and bottom buffering units are mounted on a common frame.

17. The system according to claim 1, wherein said actuator is operative to move said gripper with respect to said top and bottom buffering units.

18. The system according to claim 1, wherein said actuator is operative to move said top and bottom buffering units with respect to said gripper.

19. The system according to claim 1, wherein said actuator is operative to move said gripper and top and bottom buffering units.

20. The wafer monitoring system according to claim 1, wherein said gripper is rotatable about a longitudinal axis.

21. The wafer monitoring system according to claim 1, wherein said gripper is translatable along a longitudinal axis.

22. The wafer monitoring system according to claim 1, wherein said gripper is rotatable and translatable along a longitudinal axis.

23. The wafer monitoring system according to claim 1, wherein said bottom buffering unit is situated above said gripper.

24. The wafer monitoring system according to claim 1, wherein said top buffering unit is situated above said bottom buffering unit.

* * * * *